(12) United States Patent
Mege

(10) Patent No.: US 8,952,493 B2
(45) Date of Patent: *Feb. 10, 2015

(54) MEMORY CELL DEVICE AND METHOD OF MANUFACTURE

(71) Applicant: Adesto Technology Corporation, Sunnyvale, CA (US)

(72) Inventor: Sandra Mege, Paris (FR)

(73) Assignees: Adesto Technologies Corporation, Sunnyvale, CA (US); Artemis Acquisition LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/832,761

(22) Filed: Mar. 15, 2013

(65) Prior Publication Data

US 2013/0200329 A1    Aug. 8, 2013

Related U.S. Application Data

(60) Continuation of application No. 13/346,749, filed on Jan. 10, 2012, now Pat. No. 8,420,481, which is a division of application No. 11/492,305, filed on Jul. 25, 2006, now Pat. No. 8,115,282.

(51) Int. Cl.
*H01L 29/12* (2006.01)
*H01L 45/00* (2006.01)
*G11C 13/00* (2006.01)
*H01L 27/24* (2006.01)

(52) U.S. Cl.
CPC ........ *H01L 45/1266* (2013.01); *G11C 13/0011* (2013.01); *H01L 45/085* (2013.01); *H01L 45/1233* (2013.01); *H01L 45/141* (2013.01); *H01L 45/142* (2013.01); *H01L 45/143* (2013.01); *H01L 45/144* (2013.01); *H01L 45/1625* (2013.01); *H01L 45/1658* (2013.01); *H01L 27/24* (2013.01); *H01L 45/1608* (2013.01)
USPC ............... 257/613; 257/5; 257/179; 257/200; 257/E45.002; 438/57; 438/257

(58) Field of Classification Search
USPC ...................... 257/179, 200, 613; 438/57, 257
See application file for complete search history.

(56) References Cited

U.S. PATENT DOCUMENTS

2008/0078983 A1* 4/2008 Raberg .............................. 257/4

* cited by examiner

*Primary Examiner* — Lynn Gurley
*Assistant Examiner* — Vernon P Webb

(57) ABSTRACT

According to one embodiment of the present invention, a solid state electrolyte memory cell includes a cathode, an anode and a solid state electrolyte. The anode includes an intercalating material and first metal species dispersed in the intercalating material.

12 Claims, 3 Drawing Sheets

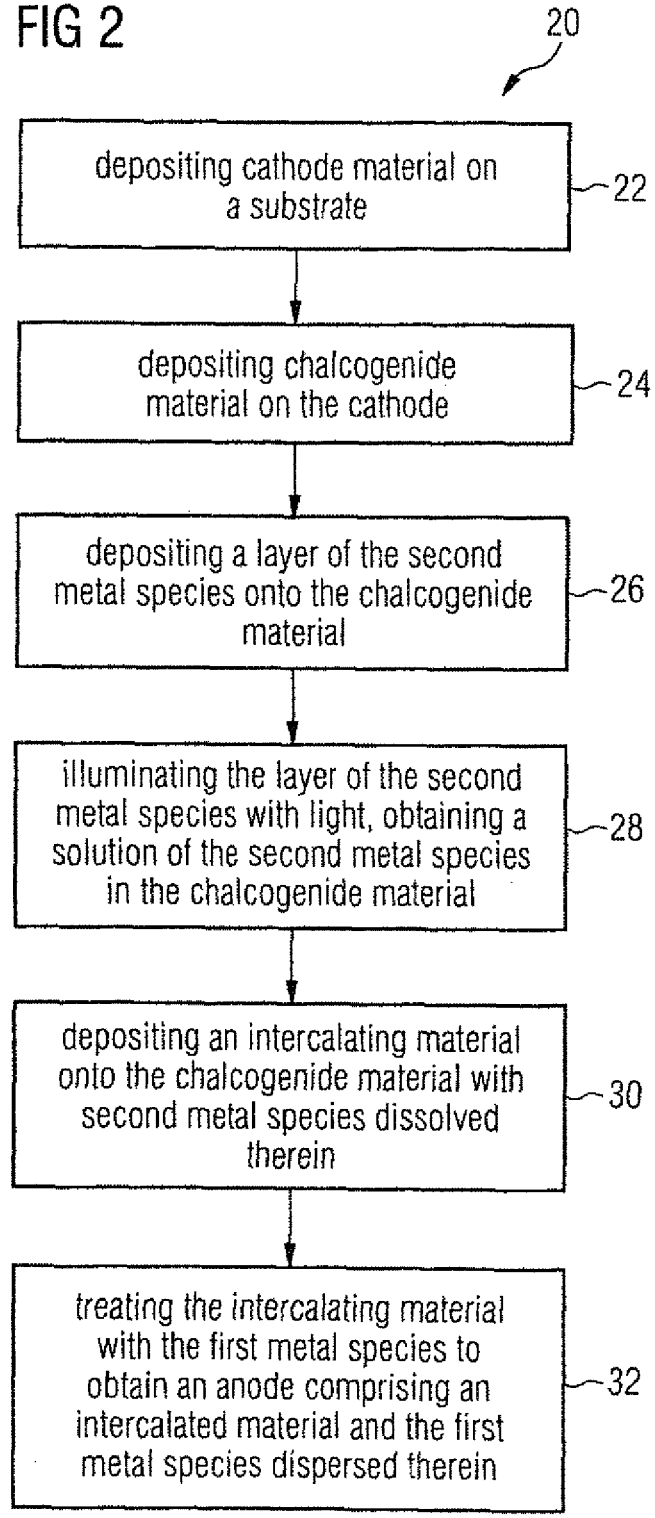

MEMORY CELL DEVICE AND METHOD OF MANUFACTURE

CROSS REFERENCE TO RELATED APPLICATIONS

The present application is a Continuation application of Ser. No. 13/346,749, filed on Jan. 10, 2012, which is a Divisional application of U.S. patent application Ser. No. 11/492,305, filed on Jul. 25, 2006, which is incorporated herein by reference.

TECHNICAL FIELD

The invention relates to a semiconductor memory with resistively switching memory cells and to a method for manufacturing a semiconductor memory device with non-volatile, resistively switching memory cells.

BACKGROUND

The development of semiconductor memory technology is essentially driven by the requirement for increasing the performance of the semiconductor memories in conjunction with miniaturization of the feature sizes. However, further miniaturization of the semiconductor memory concepts based on storage capacitors may be difficult due to the large quantity of charge that is required for writing to and reading from the storage capacitors, which leads to a high current demand. Therefore, thought is increasingly being given to new cell concepts that are distinguished by a significantly lower quantity of charge for the writing and reading operation. Semiconductor memories having a resistance memory element that exhibits a bipolar switching behavior are one such new promising circuit architecture.

In order to provide maximum density of memory units, it is desirable to provide a cell field consisting of a plurality of memory cells, which are conventionally arranged in a matrix consisting of column and row supply lines, called also word and bit lines, respectively. The actual memory cell is usually positioned at the crosspoints of the supply lines that are made of electrically conductive material. The word and bit lines are each electrically connected with the memory cell via an upper or top electrode and a lower or bottom electrode. To perform a change of the information content in a particular memory cell at the addressed crosspoint, or to recall the content of the memory cell, the corresponding word and bit lines are selected either with a write current or with a read current. To this end, the word and bit lines are controlled by appropriate control means.

There are several memory cells that are able to fit into such memory cell arrangement.

For example, RAM (Random Access Memory) comprises a plurality of memory cells that are each equipped with a capacitor that is connected with a so-called selection transistor. By selectively applying a voltage at the corresponding selection transistor via the word and bit lines, it is possible to store electric charge as an information unit (bit) in the capacitor during a write process and to recall it again during a read process via the selection transistor. A RAM memory device is a memory with random access, i.e., data can be stored under any particular address and can be read out again under this address later.

Another kind of semiconductor memory is DRAM (Dynamic Random Access Memory), which comprises in general only one single, correspondingly controlled capacitive element, e.g., a trench capacitor, with the capacitance of which one bit each can be stored as charge. This charge, however, remains for a relatively short time only in a DRAM memory cell, so that a so-called "refresh" must be performed regularly, wherein the information content is written in the memory cell again.

Since it is intended to accommodate as many memory cells as possible in a RAM memory device, one has been trying to realize them as simple as possible and on the smallest possible space, i.e., to scale them. The previously employed memory concepts (floating gate memories such as flash and DRAM) will, due to their functioning that is based on the storing of charges, presumably meet with physical scaling limits within foreseeable time. Furthermore, in the case of the flash memory concept, the high switching voltages and the limited number of read and write cycles, and in the case of the DRAM memory concept the limited duration of the storage of the charge state, constitute additional problems.

The CBRAM (conductive bridging RAM) memory cell, also known as a programmable metallization cell ("PMC"), may be switched between different electric resistance values by bipolar electric pulsing. In the simplest embodiment, such an element may be switched between a very high (off resistance) and a distinctly lower (on resistance) resistance value by applying short current or voltage pulses. The switching rates may be less than a microsecond. Very high ratios of the off resistance (R(off)) to the on resistance (R(on)) are achieved in the case of the CBRAM cells, due to the very high-resistance state of the solid electrolyte material in the non-programmed state. Typical values are $R(off)/R(on) > 10^6$ given $R(off) > 10^{10} \Omega$ and an active cell area $< 1 \ \mu m^2$. At the same time, this technology is usually characterized by low switching voltages of less than 100 mV for initiating the erase operation and less than 300 mV for the write operation.

In structural terms, a CBRAM cell is a resistance memory element comprising an inert cathode electrode, a reactive anode electrode and a solid state electrolyte arranged between the cathode and anode. The term "solid state electrolyte," as referred to herein, includes all solid state materials in which at least some ions can move under the influence of an electric field.

The surfaces of the chalcogenide material, usually provided in a CBRAM cell are deposited by means of sputtering methods, have an amorphous structure and frequently contain superfluous chalcogenides that are poorly bound so that these weakly bound chalcogenide atoms are conglomerated like clusters and cannot be removed, which leads to the formation of Ag-chalcogenide conglomerates or protrusion defects in the Ag doping and electrode layer, which usually is made of Ag. In addition, the etch process of noble metals is difficult as no etch chemistry exists for etching silver, for example. It is, thus, difficult to obtain a homogeneous, planar anode for the CBRAM cells using silver. Current approach is to simultaneously deposit silver together with the other metallic material in a co-sputtering process. However, the planarization and the structuring of the anode has to be done using a physical process.

SUMMARY OF THE INVENTION

The present invention provides a novel CBRAM cell and a method for manufacturing a CBRAM cell according to the invention.

In accordance with one embodiment of the present invention, there is provided a CBRAM memory cell, comprising an anode comprising metal species in an intercalation material.

BRIEF DESCRIPTION OF THE DRAWINGS

In the following, the invention will be explained in more detail with reference to the exemplary embodiments and drawing, in which:

FIG. 2 shows a process for manufacturing a CBRAM memory cell according to one embodiment of the invention.

DETAILED DESCRIPTION OF ILLUSTRATIVE EMBODIMENTS

Figure 1A:
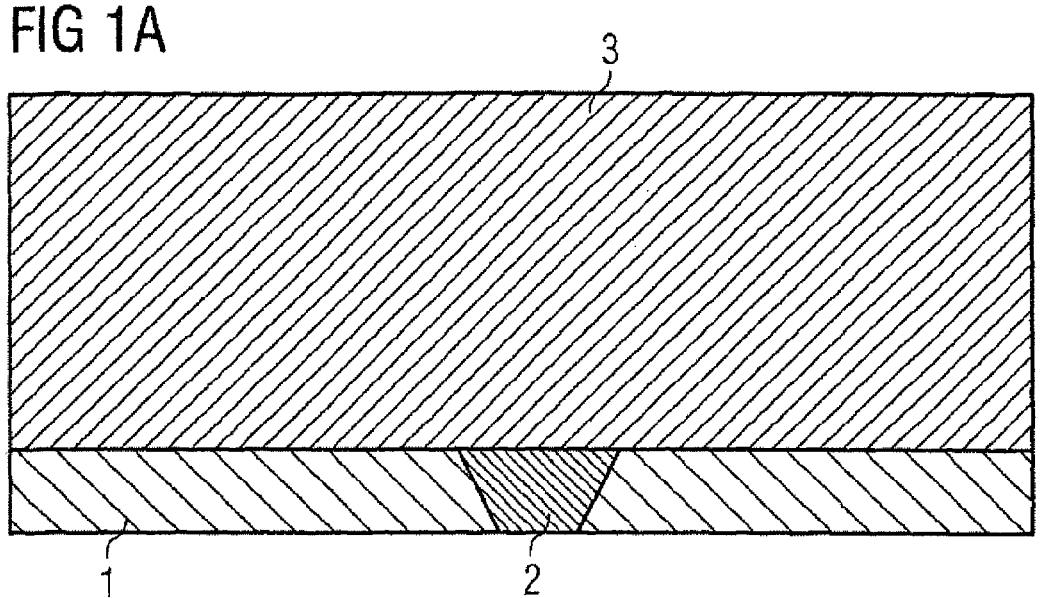
FIGS. 1a-1d show the manufacturing steps for a CBRAM memory cell according to one embodiment of the invention.

"Intercalation material" in the context of the description may be understood as any material with a property that a guest species, such as silver or copper, can be inserted therein and extracted therefrom with little or no structural modification of the intercalation material. By using metal atoms intercalated within the intercalation material in accordance with one embodiment of the invention, it is possible to obtain a homogeneous surface of the anode in a CBRAM cell without having any conglomerates of the metal, e.g., of the silver, which could lead to the protrusion defects and inhomogeneous surface of the anode. A further advantage of one embodiment of the present invention is that the intercalation material can be etched much easier than a solid silver layer.

In one embodiment of the invention, the intercalation material is a carbon material, and the metal species intercalated within carbon material are silver atoms. There are several forms of carbon materials that can be used as the intercalation material. Some examples of the carbon material are graphite, graphite sphere, petroleum coke, needle coke, carbon fiber, hard carbon, etc.

In another embodiment of the invention, the intercalation material is selected from the group consisting of silicon, inorganic materials and organic polymeric materials. The examples for the inorganic materials are $MoS_2$, $MnO_2$, $MnO_x$, $CoO_x$, $CoMnO_x$, $TiS_2$, $NbSe_3$, $VO_x$, $V_2O_5$, $CuCl_2$, etc. The examples for the organic polymeric materials are polyacetylene, polypyrrole, polyanilene or polythiothene. In a further embodiment of the invention the inorganic materials for the intercalation material are $MnO_x$, $CoO_x$, $CoMnO_x$.

The CBRAM (conductive bridging RAM) memory cell used in one embodiment of the invention, also known as a programmable metallization cell ("PMC"), may be switched between different electric resistance values by bipolar electric pulsing. In the simplest embodiment, such an element may be switched between a very high (off resistance) and a distinctly lower (on resistance) resistance value by applying short current or voltage pulses. The switching rates may be less than a microsecond. Very high ratios of the off resistance (R(off)) to the on resistance (R(on)) are achieved in the case of the CBRAM cells, due to the very high-resistance state of the solid electrolyte material in the non-programmed state. Typical values are $R(off)/R(on) > 10^6$ given $R(off) > 10^{10} \Omega$ and an active cell area $<1$ $\mu m^2$. At the same time, this technology is usually characterized by low switching voltages of less than 100 mV for initiating the erase operation and less than 300 mV for the write operation.

In structural terms, a CBRAM cell is a resistance memory element comprising an inert cathode electrode, a reactive anode electrode and a solid state electrolyte arranged between the cathode and an anode. The term "solid state electrolyte," as referred to herein, includes all solid state materials in which at least some ions can move under the influence of an electric field.

The solid state electrolyte used in the CBRAM cells is typically a chalcogenide-metal compound (also referred to as chalcogenide material) comprising ions of an electrically conducting material, which is usually silver. Chalcogenide materials that can be used are compositions of sulfur, selenium and/or tellurium with metals such as arsenic, germanium, bismuth, nickel, and zinc. The chalcogenide material/silver ion composition may be obtained by photodissolution of a silver layer, by co-depositing chalcogenide material and silver (or other materials), by sputtering using a source comprising the chalcogenide and the metal, or by other methods, such as doping, thermal dissolution, etc.

In order to obtain a solid state electrolyte for the CBRAM cell starting from chalcogenide materials, metal ions have to be introduced into the chalcogenide network. Silver is usually introduced into chalcogenide material by illuminating a thin silver film deposited onto the chalcogenide material typically with light of wavelength less than 500 nanometers. If sufficient silver is present, the process results in the saturation of the chalcogenide material with silver through the formation of a silver compound with the chalcogenide material. Such silver compounds may or may not have defined stoichiometry. In some cases the silver content in the chalcogenide material may be below the saturation level, but in other instances it is desirable to fully saturate the chalcogenide material with silver or other metal ions. The content of the metal ions in the chalcogenide material can be controlled by the thickness of the silver layer, which is subjected to photodissolution.

Through application of an electric field between the two electrodes, it is possible to produce a conductive path (clearly a conductive filament) through the carrier material and to clear it away again. Depending on the polarity of the electrical pulses applied between anode electrode and cathode electrode, the reactive anode electrode can be dissolved electrochemically and the metal-rich deposits on the carrier material are intensified, which then leads to an electrically conductive connection between the electrodes. By reversing the electrical pulse the electrically conductive connection is resolved and the metal ions are deposited from the carrier material on the anode electrode.

As the reactive anode electrode is dissolved electrochemically to form the metal-rich deposits in the solid state electrolyte the typically used anode is made of silver or comprises silver, in the case the silver ions are also present in the chalcogenide material. The cathode used in a CBRAM cell can be made of any conducting material since the cathode is inert and does not participate in the electrochemical processes. Typical materials for the cathode are, for example, W, TiN, TiW, TiAlW, even though any conductive material can be used.

The surfaces of the chalcogenide material that are deposited by means of sputtering methods have an amorphous structure and frequently contain superfluous chalcogenides that are poorly bound so that these weakly bound chalcogenide atoms are conglomerated like clusters and cannot be removed, which leads to the formation of Ag-chalcogenide conglomerates or protrusion defects in the Ag doping and electrode layer. In addition, the etch process of noble metals is difficult as no etch chemistry exists for etching silver for example. It is, thus, difficult to obtain a homogeneous, planar anode for the CBRAM cells using silver.

One embodiment of the present invention is directed toward CBRAM cells with an anode comprising an intercalation layer comprising metal atoms. Many specific details of the invention are described below with reference to the methods of manufacturing such CBRAM cells. A person skilled in the art will, however, understand that the present invention may have additional embodiments, be used in connection with materials not described therein or that the invention may be practiced without several of the details described below.

In accordance with one embodiment of the present invention, there is provided a CBRAM memory cell, comprising an anode that comprises metal species in an intercalation material. "Intercalation material" is any material with a property that a guest species such as silver or copper can be inserted therein and extracted therefrom with little or no structural modification of the intercalation material.

FIG. 1a shows the schematic structure of a CBRAM memory cell comprising a layer stack constructed on a substrate 1 after several process steps. For example in accordance with FIG. 1a, the metallization for the cathode 2 is deposited on a substrate 1 and patterned using lithographic techniques. By way of example, tungsten, TiN, TiW, TiAlN or others may be used as an electrode material for the cathode 2. After patterning the cathode the chalcogenide material 3 is deposited and patterned. The deposition of the chalcogenide material 3 is done using, for example, reactive sputtering techniques with targets selected from, for example, S, Se and/or Te on the one hand and germanium, bismuth, nickel, and/or zinc on the other hand. The layer thickness of the chalcogenide material is approximately 50 nm-100 nm in this particular example. The size of the cell can be approximately 1 µm×1 µm, but both larger and smaller cells can also be prepared using the method described herein.

Next (not shown), metal, e.g., silver is introduced into the chalcogenide material in order to form a solid state electrolyte 4. The introduction of silver can take place either by illuminating a thin silver film deposited onto the chalcogenide material with light of wavelength less than 500 nanometers or in a sputter process by using an Ag sputter target.

Figure 1B:
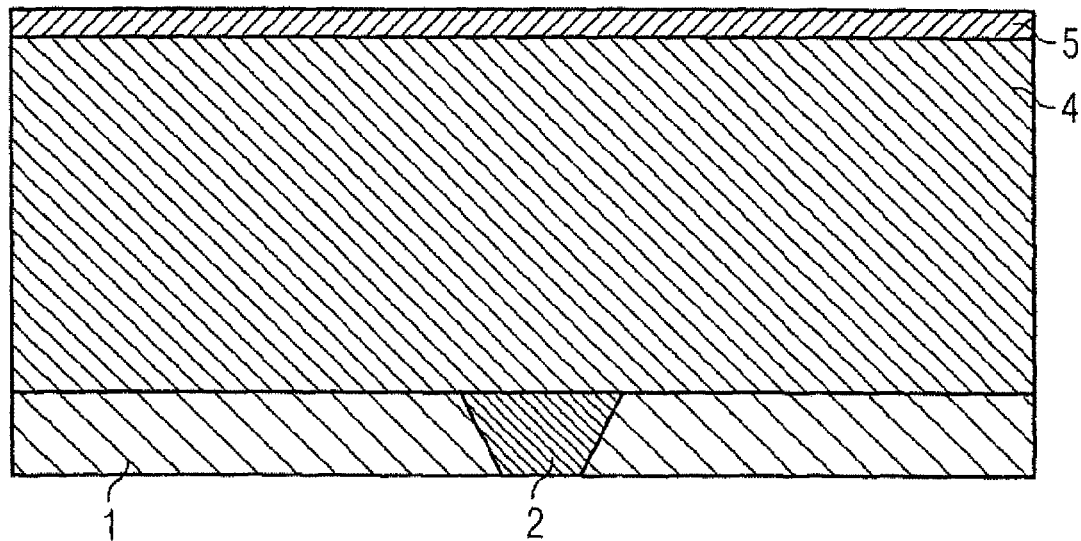

Then, as shown in FIG. 1b, an intercalation layer 5 is deposited onto the solid electrolyte 4. The typical thickness of the intercalation layer is in a range of about 30 nm to about 100 nm. In one embodiment of the invention the intercalation layer 5 comprises a carbon material. The advantage of using carbon material for the intercalation layer 5 is that many carbon materials are industrially available having versatile electrical and physical characteristics. A further advantage of using carbon for the intercalating layer 5 is that carbon can be etched chemically in a very simple manner by using for example $CF_4$. The basic building block of graphite-type carbon materials is a sheet of carbon atoms arranged in a hexagonal array and stacked in a specific fashion. Between two neighboring carbon sheets, metal atoms or ions can be intercalated. Depending on the method of preparation of the intercalation layer the properties of the anode can be varied.

The intercalation layer comprising carbon can be prepared starting from various precursors that can be in the vapor, liquid or in a solid phase. By choosing the precursors in the liquid phase artificial graphite, petroleum coke or coal tar coke can be produced for example. By choosing vapor phase precursors vapor grown carbon fiber or acetylene black can be obtained for example. Further, from the solid phase precursors, carbon materials such as resin pyrolytic graphite can be obtained. By choosing the appropriate conditions several forms of carbon materials that can be used as the intercalation material, for example, graphite sphere, petroleum coke, needle coke, carbon fiber, hard carbon, etc., can be obtained.

The intercalation layer 5 can be prepared in situ starting from the carbon precursors or in a sputtering process with a carbon target. The surface area of the material building the intercalation layer is usually in the range of 0.8 to 40 $m^2/g$, wherein the range of 0.5 to 5 $m^2/g$ is advantageous for some applications. As the surface area correlates with the particle size and particle size distribution, carbon materials having an average particle size approximately 30-50 µm may be used.

In another embodiment of the invention the intercalation layer 5 includes silicon as there are a plurality of techniques known that can be used to deposit all kinds of silicon layers. Typical techniques to deposit a silicon layer is atmospheric pressure (AP), low pressure (LP), plasma enhanced (PE) chemical vapor deposition (CVD) techniques. Furthermore, silicon can be easily doped with silver atoms and readily both wet and dry etches using, for example, HF for wet etching or $CF_4$ for the dry etching.

In an alternative embodiment of the invention, the intercalation layer 5 includes a material selected from the group consisting of inorganic materials. Generally all metal oxides can be used but transition metal oxides may also be used as intercalating materials. In one embodiment of the invention, metal oxides such as $MoS_2$, $MnO_x$, $CoO_x$, $CoMnO_x$, $TiS_2$, $NbSe_3$, $VO_x$, $V_2O_5$, $CuCl_2$ may be used. In these compounds, a guest species such as silver atoms can be inserted interstitially into the host lattice of the intercalating materials as described below and subsequently extracted with little or no structural modification of the intercalating material. An advantage of the inorganic salts is the easiness of preparation using for example sputtering processes.

In a further embodiment of the invention, organic polymeric materials can be used as intercalating materials for the intercalation layer 5. All organic polymers that exhibit some electrical conductivity when doped with silver atoms can be used as intercalating materials. Typical polymeric materials for the purposes of the invention are polyacetylene, polypyrrole, polyaniline and polythiophene.

As described above, it is possible to produce a conductive path such as a conductive filament through the solid state electrolyte 4 and to clear it away again by applying an electric field between the two cathode and the anode. Depending on the polarity of the electrical pulses applied between anode electrode and cathode electrode, the reactive anode electrode is dissolved electrochemically and the metal-rich deposits on the carrier material are intensified, which then leads to an electrically conductive connection between the electrodes.

Figure 1C:
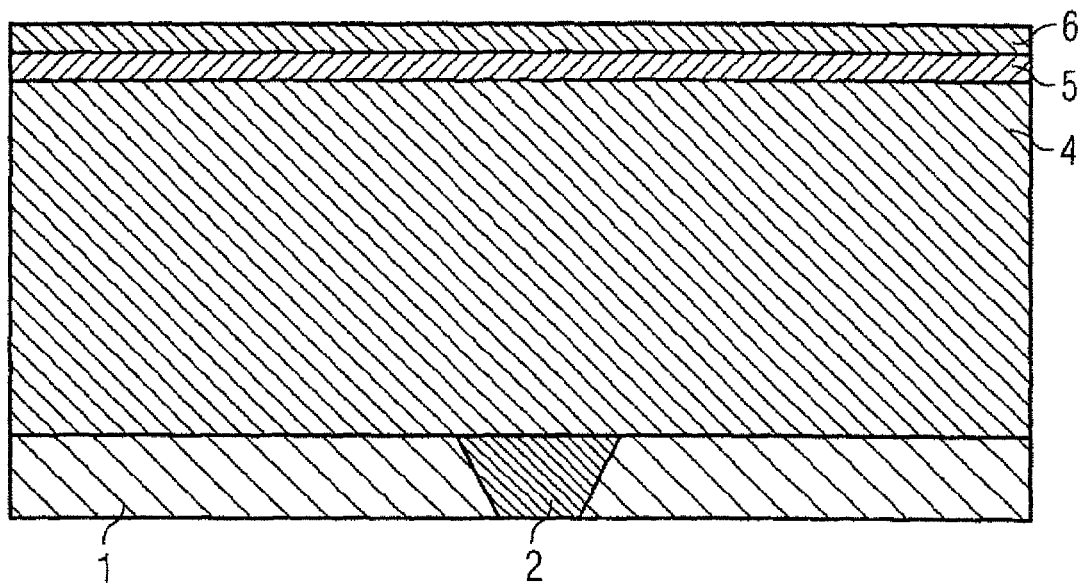
Figure 1D:
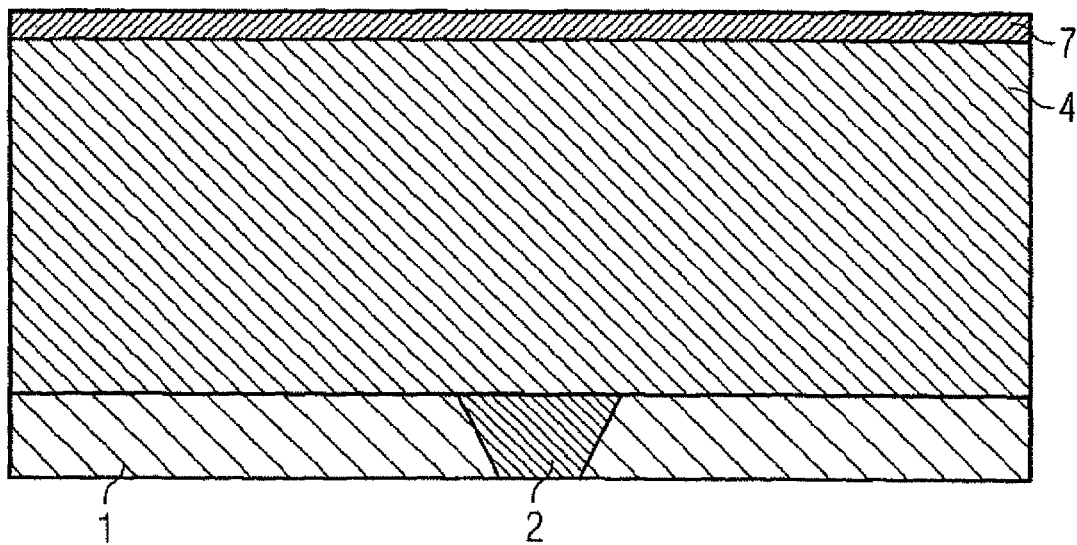

Therefore, the anode includes a reservoir of the metal atoms that can be dissolved into the solid electrolyte, when an electrical pulse is applied. As shown in FIG. 1c, a metal layer 6 including material used for the reactive anode is deposited onto the intercalation layer 5. After a subsequent dissolution, for example by annealing, the metal atoms are inserted interstitially into the host lattice of the intercalation layer 5 to build an anode 7 of the CBRAM cell as shown in FIG. 1d. The intercalating material and metal can be also co-sputtered to immediately obtain the anode 7. In an alternative embodiment of the invention, the metal atoms are implanted into the intercalation material using ion implantation. In one embodiment of the invention, the anode 7 includes intercalating material and silver atoms.

Lithographic techniques and wet or dry etching can then be used to obtain a CBRAM cell according to one embodiment of the present invention.

In one embodiment of the invention a CBRAM cell is prepared according to a process as shown in a flow diagram 20 in FIG. 2. According to this embodiment a CBRAM cell is manufactured by depositing cathode material, such as tungsten, TiN, TiW, TiAlN or some other material that can be used to manufacture a cathode (process 22). After the deposition of the cathode material, such material can be patterned to form the cathode if necessary.

After the formation of the cathode, the chalcogenide material is deposited thereafter and if necessary patterned (process 24). The chalcogenide material can extend over the surface of the cathode or cover only partially cover the surface of the cathode depending on the desired architecture of the CBRAM cell.

In a next process (process 26), a layer of the second metal species, such as silver may be deposited onto the chalcogenide material. When illuminating the layer of the second metal species with light (process 28), a photo dissolution takes place forming thereby a solution of the second metal species in the chalcogenide material. Alternatively, the second metal species can be introduced into the chalcogenide material by sputtering or ion implantation for example. The sputtering can take place by a simultaneous deposition of the chalcogenide material and the second metal species, for example, by co-sputtering, or by depositing the chalcogenide material first and introducing the second metal species in a further step.

After forming a solid state electrolyte from the chalcogenide material and the second metal species, an intercalating material may be deposited thereon (process 30). The intercalation material may be carbon-containing material, silicon, inorganic materials such as inorganic oxide(s) and organic polymers. The typical thickness of the intercalation layer is approximately in a range of 30 to 100 nm.

Then the intercalating material may be treated with the first metal species to obtain an anode comprising an intercalated material and the first metal species dispersed therein (process 32).

A CBRAM cell in accordance with one embodiment of the present invention can be part of an arrangement comprising a plurality of memory cells arranged for example on the crosspoint between the word and the bit lines. The cells can further be equipped with a capacitor, which is connected with a so-called selection transistor. By selectively applying a voltage at the corresponding selection transistor via the word and bit lines, it is possible to store electric charge as an information unit (bit) in the capacitor during a write process and to recall it again during a read process via the selection transistor.

From the foregoing it will be appreciated that specific embodiments of the invention have been described herein for the purposes of illustration, but that various modifications may be made without departing from the spirit and scope of the invention. Accordingly, the invention is not limited except as by the appended claims.

What is claimed is:
1. A memory cell, comprising:
an anode electrode comprising a layer of an inorganic intercalating material and at least a first metal species dispersed in the inorganic intercalating material;
a cathode electrode; and
a solid state electrolyte formed between the anode and cathode electrodes, wherein the solid state electrolyte is programmable between different resistance values by electric pulsing.
2. The memory cell of claim 1, wherein:
the anode electrode comprises titanium.
3. The memory cell of claim 1, wherein:
the anode electrode comprises copper.
4. The memory cell of claim 1, wherein:
the anode electrode comprises copper and titanium.
5. The memory cell of claim 1, wherein:
the layer of intercalating material has a thickness in the range of about 30 nm to 100 nm.
6. The memory cell of claim 1, wherein:
the cathode electrode comprises titanium.
7. The memory cell of claim 1, wherein:
the cathode electrode comprises a material selected from the group of: W, TiN, TiW, and TiAlN.
8. An integrated circuit device, comprising:
a plurality of memory cells, each memory cell comprising a cathode electrode, a solid electrolyte layer, and
an anode electrode that includes an inorganic intercalating material, and
a first metal species dispersed in the inorganic intercalating material; wherein
each memory cell is switchable between different resistance values by bipolar electric pulsing.
9. The integrated circuit device of claim 8, wherein:
the anode electrode of each memory cell comprises titanium.
10. The integrated circuit device of claim 8, wherein:
the anode electrode of each memory cell comprises copper.
11. The integrated circuit device of claim 8, wherein:
the anode electrode of each memory cell comprises copper and titanium.
12. The integrated circuit device of claim 8, wherein:
the memory cells are arranged between bit lines and word lines.

* * * * *